(12) United States Patent
Iwamoto

(10) Patent No.: US 8,604,775 B2
(45) Date of Patent: Dec. 10, 2013

(54) CURRENT DETECTION DEVICE

(75) Inventor: Reiji Iwamoto, Nagoya (JP)

(73) Assignee: Denso Corporation, Kariya (JP)

( * ) Notice: Subject to any disclaimer, the term of this patent is extended or adjusted under 35 U.S.C. 154(b) by 287 days.

(21) Appl. No.: 13/274,581

(22) Filed: Oct. 17, 2011

(65) Prior Publication Data
US 2012/0091995 A1    Apr. 19, 2012

(30) Foreign Application Priority Data

Oct. 18, 2010 (JP) .................................. 2010-233245

(51) Int. Cl.
*G01R 33/07* (2006.01)
(52) U.S. Cl.
USPC ........................ 324/117 H; 324/126; 324/127
(58) Field of Classification Search
None
See application file for complete search history.

(56) References Cited

U.S. PATENT DOCUMENTS 5,172,063 A * 12/1992 Munikoti et al. ............. 324/537
5,923,162 A *  7/1999 Drafts et al. ............... 324/117 H
6,144,196 A * 11/2000 Tamaki ...................... 324/117 R

FOREIGN PATENT DOCUMENTS

| JP | 2000-266785 | 9/2000 |
|---|---|---|
| JP | 2007-85951 | 4/2007 |
| JP | 2008-002876 | 1/2008 |
| JP | 2008-20402 | 1/2008 |
| JP | 2008-134118 | 6/2008 |
| JP | 2009-229165 | 10/2009 |

OTHER PUBLICATIONS

Office Action dated Sep. 11, 2012 in corresponding Japanese Application No. 2010-233245 with English translation.

* cited by examiner

*Primary Examiner* — Vinh Nguyen
(74) *Attorney, Agent, or Firm* — Harness, Dickey & Pierce, PLC

(57) ABSTRACT

In a wiring pattern formed on a printed circuit board, a current detection pattern having a predetermined area is formed in the wiring pattern for detecting a current, which flows to a subject body for current measurement, based on magnetic flux density generated by the current. The current detection pattern is formed of a same material as the wiring pattern. An excitation current is supplied to the current detection pattern for detecting the magnetic flux density. An output voltage outputted from the current detection pattern in correspondence to the excitation current and the magnetic flux density is measured. The current flowing to the subject body is calculated based on the magnetic flux density calculated from the excitation current and the output voltage.

9 Claims, 7 Drawing Sheets

CURRENT DETECTION DEVICE

CROSS REFERENCE TO RELATED APPLICATION

This application is based on and incorporates herein by reference Japanese patent application No. 2010-233245 filed on Oct. 18, 2010.

FIELD OF THE INVENTION

The present invention relates to a current detection device, which detects a current by using Hall effect.

In an electronic control apparatus, a current flowing in a specified point is detected by using a current detection device so that an excessive current is prevented from flowing or a control (for example, current feedback control) is performed based on a detected current value. Some electronic control apparatuses mounted in vehicles continue to operate even when engines are stopped. In such an electronic control apparatus, its operation is stopped or its operation mode is switched to reduce consumption of electric power of a battery when a consumed current, which is measured by a current detection device, exceeds a predetermined value.

The current detection device is formed of, for example, a resistor (shunt resistor) for current detection, and a measuring circuit for measuring a current value from a voltage developed between both ends of the resistor. The measuring circuit part is formed as an IC (patent document 1).

In conventional coil-type current sensors, a coil is formed in a line pattern on a substrate (patent document 2).

A conventional Hall element is also used to detect a current value. According to the Hall effect, the direction of movement of electrons flowing in a metal or a semiconductor is deflected by magnetic field. The degree of deflection is varied in accordance with magnitudes of a current and a magnetic field. A current is measured by detecting, as the degree of deflection, a change in an output voltage of a Hall element (patent document 3).

[Patent document 1] JP 2009-229165A
[Patent document 2] JP 2007-085951A
[Patent document 3] JP 2008-020402A According to the patent document 1, a coulomb counter is used to output a count value, which is proportional to an input voltage corresponding to a potential difference between both ends of a sensing resistor. Since it is a discrete element, it costs high. This element cost corresponds to a considerable percentage of an entire cost of the electronic control unit. It is not suited to in-house manufacture for cost reduction and hence not suited to installation in a comparatively small-sized electronic control apparatus. Since the shunt resistor generates heat, measurement of the current is limited to a narrow range (less than about 20 A).

The coil-type current sensor according to the patent document 2 or a conventional current transformer is comparatively large in size and hence is not suited to electronic control apparatuses for vehicles.

The current sensor using the Hall element according to the patent document 3 is supplied as a current sensor IC (general-purpose device), which uses InSb, GaAs or InAs semiconductor as a Hall element. It is therefore not suited either in reducing cost of an electronic control apparatus.

SUMMARY OF THE INVENTION

It is therefore an object of the present invention to provide a current detection device, which is simple in construction and low in cost.

According to the present invention, a current detection device comprises a circuit substrate, a wiring pattern including a current flow path and a current detection pattern, both of which are formed on the circuit substrate. The current detection pattern has a predetermined area for detecting a current, which flows to a subject body for current measurement through the current flow path, based on magnetic flux density generated by the current. The current detection pattern is formed of a same material as the current flow path of the wiring pattern and has Hall effect.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
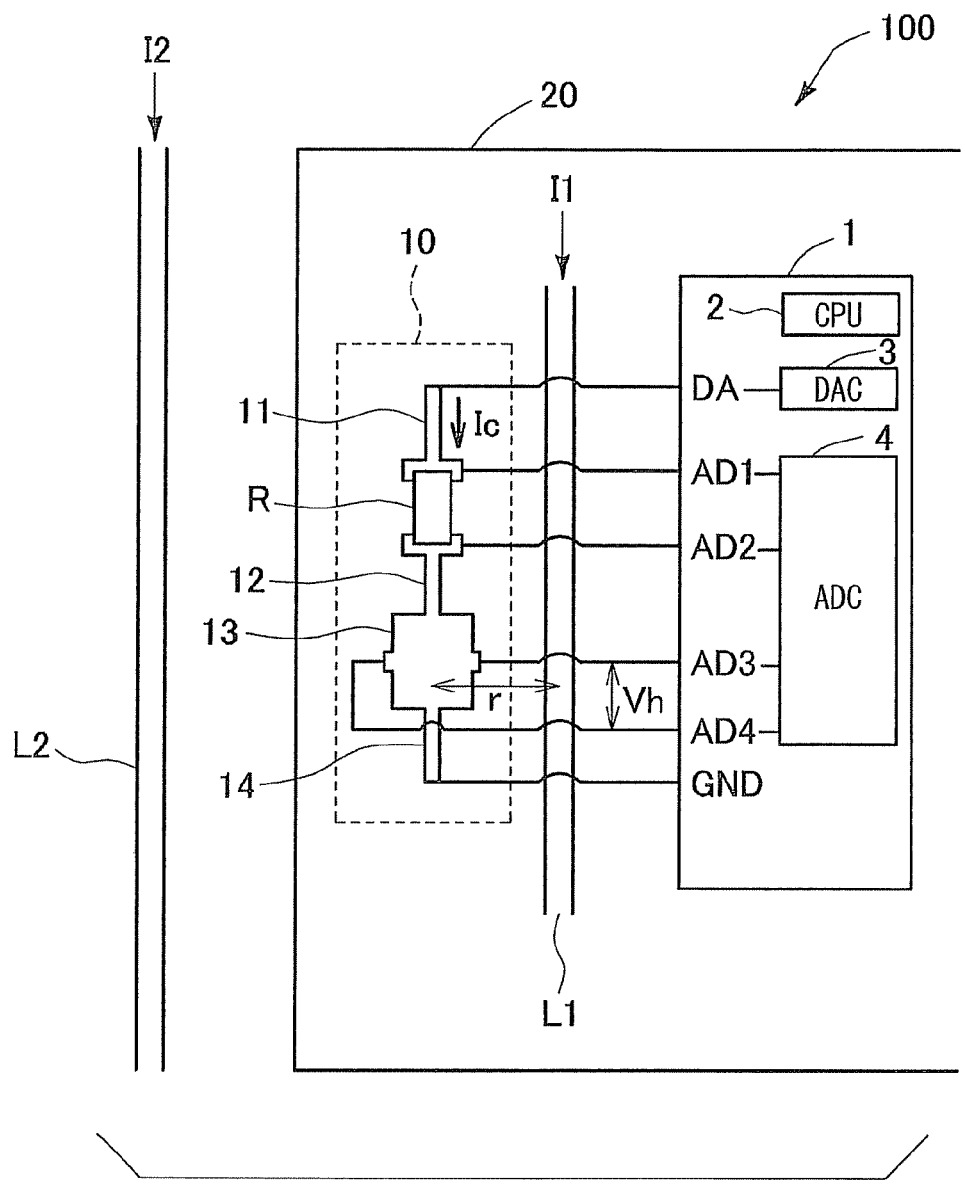
FIG. 1 is a schematic diagram of a current detection device according to one embodiment of the present invention.

The present invention will be described with reference to embodiments shown in the drawings.

Referring to FIG. 1, a current detection device 100 is formed of a central processing and calculation circuit 1 mounted on a substrate (that is, a printed-circuit board) 20, a current flow path L1 formed on the substrate 20, a current detection pattern 13 formed as a part of wiring pattern and a resistor R connected in series with an input side of an excitation current Ic of the current detection pattern 13.

The central processing and calculation circuit 1 is formed of a conventional microcomputer, which includes, for example, a CPU 2, a ROM, a RAM and peripheral circuits (only CPU 2 is illustrated). The CPU 2 executes programs stored in the ROM to perform various functions of the current detection device 100. The CPU 2 corresponds to a current calculation section, an excitation current calculation section and an excitation current regulation section.

The central processing and calculation circuit 1 includes a DAC 3 and an ADC 4, which are a conventional D/A converter and a conventional A/D converter, respectively. The DAC 3 outputs from its DA terminal an analog voltage corresponding to a value set by the CPU 2. The ADC 4 converts values of analog voltages inputted from four terminals AD1 to AD4 to corresponding digital values, which are suitable for arithmetic calculation in the CPU 2. The DAC 3 corresponds to an excitation current supply section. The ADC 4 corresponds to a resistor voltage measurement section.

The DA terminal of the central processing and calculation circuit 1 and the resistor R are connected by a wiring pattern 11 made of a conductive metal. The resistor R and the current detection pattern 13 are connected by a wiring pattern 12 made of a conductive metal. The current detection pattern 13 and a GND (ground) terminal of the central processing and calculation circuit 1 are connected by a wiring pattern 14 made of a conductive metal. The terminal AD1 is connected to a terminal, which is at a positive-potential side relative to a direction of flow of the excitation current Ic flowing in the resistor R. The terminal AD2 is connected to a terminal, which is at a negative-potential side of the resistor R relative to the direction of flow of the excitation current Ic. The terminal AD3 is connected to one terminal 132 (shown in FIG. 2) of output terminals of the current detection pattern 13. The terminal AD4 is connected to a terminal 134 (shown in FIG. 2) of the current detection pattern 13.

The current detection pattern 13, the resistor R and the wiring patterns 11, 12 and 14, which are in a straight line shape form a sensor section 10.

The resistor R is a chip resistor, which is surface-mounted. The chip resistor has a high precision range of about ±0.01% error rate and a low resistance value. Thus it is possible to detect precisely the excitation current Ic, which is required to be maintained at a constant value (driven with a constant current).

If changes in the resistance value of the current detection pattern 13 caused by temperature changes are negligible, that is, the value of the excitation current Ic does not change, the resistor R may be eliminated.

The current path L1, which is a subject for current measurement, is formed as a straight line wiring pattern on the substrate 20 or a cable. The direction of flow of a current I1 is the same as that of the excitation current Ic flowing in the sensor section 10. The current path, that is, subject for current measurement, need not necessarily be formed on the same substrate 20 but may be formed on a different substrate like a current path L2 or may be a current cable, which supplies a current from a power supply source to a device or an actuator. In this case, the current detection device 100 is used as a current probe.

Figure 2A:
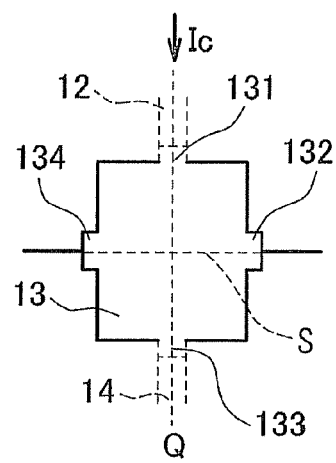
FIGS. 2A to 2C are diagrams of examples of shapes of the current detection patterns.
Figure 2B:
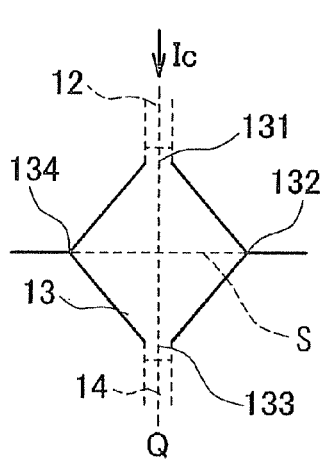
Figure 2C:
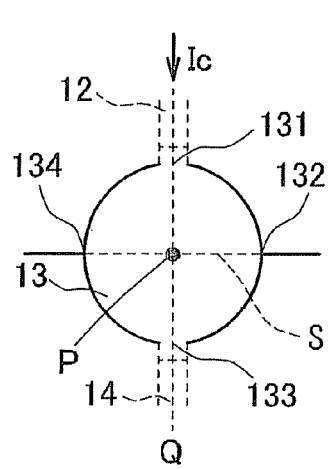

The current detection pattern 13 may be shaped as shown in FIGS. 2A to 2C. The current detection pattern 13 is formed of the same material, for example, metal such as copper, aluminum, gold or iron, as the other wiring patterns 11, 12 and 14. The current detection pattern 13 is shaped by widening general wiring patterns.

According to an example of FIG. 2A, the current detection pattern 13 is in a rectangle shape, which has an axis of symmetry Q in a direction of flow of the excitation current Ic. Assuming that the current Ic flows in the up-down direction (longitudinal direction) in the figure, the rectangle shape has long sides in the up-down direction. The input terminal 131 and the input terminal 133 of the current detection pattern 13 are formed near peripheral parts connected to the wiring pattern 12 and the wiring pattern 14, respectively. The output terminals 132 and 134 are formed at generally central parts of longitudinal sides of the current detection pattern 13. The sides are in parallel to the direction of flow of the excitation current Ic.

According to another example of FIG. 2B, the current detection pattern 13 is in a lozenge shape, which has a longer axis of symmetry Q in a direction of flow of the excitation current Ic. The lozenge shape may be longer in a lateral direction or has two diagonal lines, which are equal to each other. The input terminal 131 and the input terminal 133 of the current detection pattern 13 are formed at peak or corner parts connected to the wiring pattern 12 and the wiring pattern 14, respectively. The output terminals 132 and 134 are formed at other peak or corner parts. As an alternative of the lozenge shape, the current detection pattern 13 may be in other polygon shapes such as a hexagon shape or an octagon shape.

According to a further example of FIG. 2C, the current detection pattern 13 is in a circle shape. The input terminal 131, which is connected to the wiring pattern 12, is formed at one point on the circumference of the circle shape. The input terminal 133, which is connected to the wiring pattern 14, is formed at a crossing point between a straight line extending through a center P of the circle shape and the circumference of the circle shape. The output terminals 132 and 134 are formed at crossing points between a straight line S and the circumference of the circle shape. The straight line S is perpendicular to the straight line Q connecting the input terminal 131 and the input terminal 133 at a center P of the circle shape. Alternative to the circle shape, the current detection pattern 13 may be in an ellipse shape having an axis of symmetry Q in the direction of flow of the excitation current. As an alternative of the lozenge shape, the current detection pattern 13 may be in other polygon shapes such as a hexagon shape or an octagon shape. The input terminals 131, 133 and the output terminals 132, 134 may be shaped to protrude from a periphery of each current detection pattern or formed as parts of the periphery.

The lines Q connecting the centers of the input terminals 131, 132 and the line S connecting the centers of the output terminals 132, 134 need not cross perpendicularly. The output terminals 132, 134 need not be arranged to face each other with respect to the axis line of symmetry Q. The current detection pattern 13 may be formed in an asymmetric shape between up and down sides and between left and right sides. For example, the left side and the right side of the axis line of symmetry Q may be in a rectangle shape and a circle shape, respectively. Alternatively, the up side and the down side of the line S may be in a lozenge shape and a rectangle shape, respectively.

Figure 3:
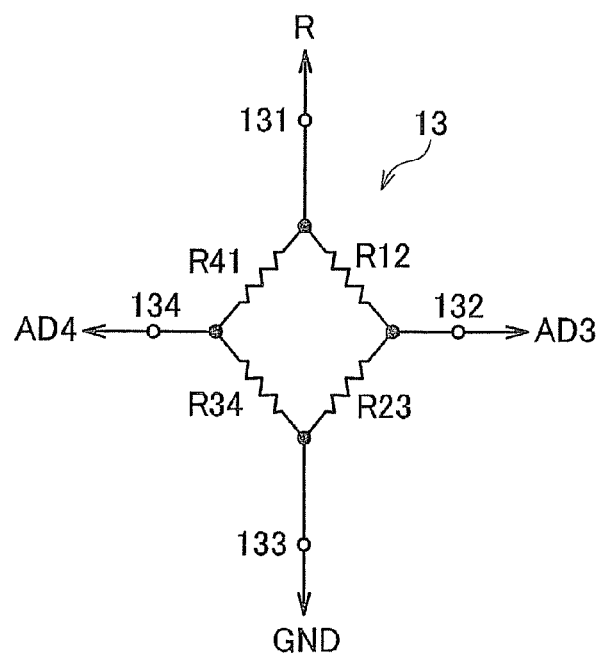
FIG. 3 is an equivalent circuit of a current detection pattern.

An equivalent circuit of the current detection pattern 13 is shown in FIG. 3. The current detection pattern 13 is formed as a bridge circuit, which includes a resistor R12 between the input terminal 131 and the output terminal 132, a resistor R23 between the output terminal 132 and the input terminal 133, a resistor R34 between the input terminal 133 and the output terminal 134, and a resistor R41 between the output terminal 134 and the input terminal 131.

Figure 4:
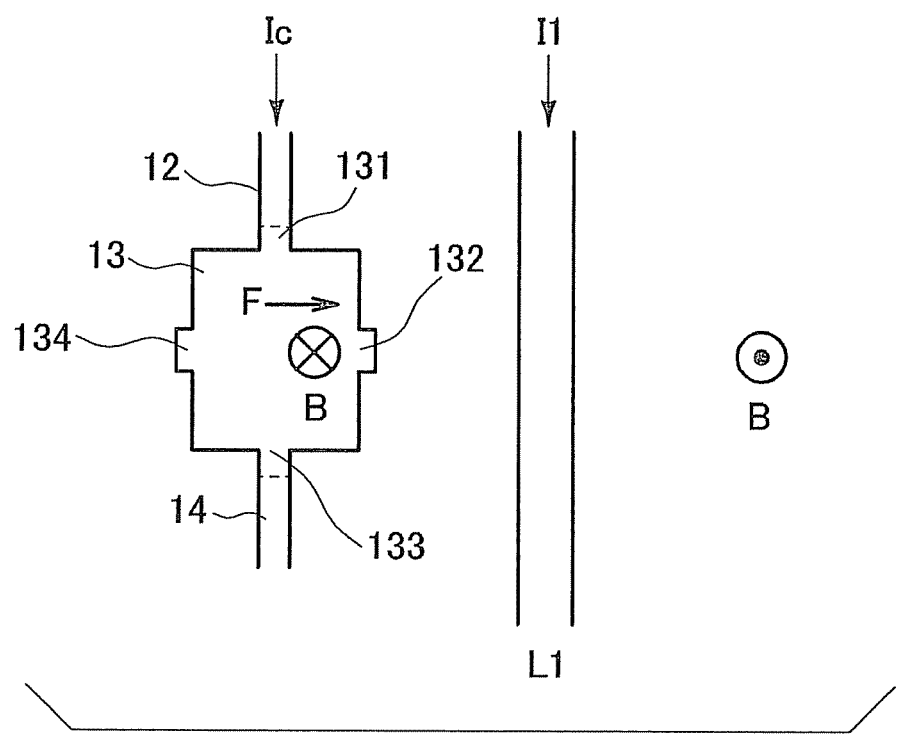
FIG. 4 is a schematic diagram showing a principle of current detection.

A current detection method will be described with reference to FIG. 4. When a current I1 flows in the current flow path L1, a magnetic field of magnetic density B proportional to the current I1 is generated around the current flow path L1 according to "corkscrew rule." When this magnetic filed passes through a plane of the current detection pattern 13 (that is, direction of thickness of the substrate 20), a Lorenz force F is generated according to "Flemings left-hand rule." The Lorenz force F restricts flow of the excitation current Ic (that is, electrons), which flows over the plane of the current detection pattern 13. The excitation current Ic is deflected to one side of the current detection pattern 13. As a result, a potential difference Vh (that is, output voltage) is developed between the output terminals 132 and 134.

The output voltage Vh is expressed as the following equation (1), in which Rh is a hole coefficient (product of electron charge and carrier density) and d is a thickness of the current detection pattern 13.

$$Vh = (Rh/d) \times Ic \times B \qquad (1)$$

The above-described current detection method is the same as that using a Hall element. The above-described Hall effect is also provided by a metal conductor other than a semiconductor Hall element.

According to the present embodiment, the semiconductor Hall element is not used. Instead, the current detection pattern 13 is formed to provide the Hall effect by the same material as that of the wiring pattern formed on the substrate.

The current detection pattern 13 is formed in a shape to detect deflection of the excitation current Ic. At least, the current detection pattern 13 is widened in a direction perpendicular to the direction of flow of the excitation current Ic, that is, in the direction of generation of Lorenz force L. The output terminals 132 and 134 are arranged at positions, where it is possible to detect the potential difference, that is, output voltage Vh generated by the bridge circuit.

Current detection processing executed by the CPU 2 of the central processing and calculation circuit 1 will be described with reference to FIG. 5. This processing is executed repetitively at every predetermined time interval. First, at S11, a predetermined value of a digital value of the DA converter 3 and an excitation voltage Vc, which is applied to the sensor section 10 (resistor R, current detection pattern 13 and the like), are set by the CPU 2. The excitation voltage Vc is set such that the excitation current Ic, which flows in the resistor R and the current detection pattern 13, attains a predetermined value. The excitation voltage Vc is outputted from the DA terminal at S12.

Next, the potentials at both ends of the resistor R are acquired from the terminals AD1 and AD2 and the voltage Vr of the resistor R, that is, resistor voltage, is measured at S13. The excitation current Ic is calculated based on the resistor voltage Vr and the resistance of the resistor R at S14.

It is checked whether the calculated excitation current Ic equals a predetermined value Icr. If it is determined that the excitation current Ic does not equal the predetermined value Icr (S15: NO), the digital value of the DA converter 3 is increased or decreased in accordance with a condition of inequality. The excitation voltage Vc, which is applied to the sensor section 10, is set again at S18. Then, a new excitation voltage Vc is outputted at S12.

If it is determined that the excitation current Ic equals the predetermined value (S15: YES), the potentials of the output terminals 132 and 134 are acquired from the terminals AD3 and AD4. The output voltage Vh, which is a voltage difference between the output terminals 132 and 134, is thus measured at S16.

Finally, the magnetic flux density B is calculated by using the equation (1) and the current I1 is calculated by using the following equation (2) at S17. In this equation, µ0 is a magnetic permeability in vacuum (1.26×10⁻⁶), r is a distance from the current I1 (FIG. 1).

$$B=(\mu 0 \times I1)/(2 \times n \times r) \quad (2)$$

It is noted that S11 to S15 and S18 may be separated as excitation current regulation processing from the current detection processing and executed at every predetermined interval different from that of the current detection processing.

Another example of the current detection processing executed by the CPU 2 of the central processing and calculation circuit 1 will be described with reference to FIG. 6. This processing is a variation of the processing shown in FIG. 5, the same processing steps are designated by the same step numbers and the same detailed description will not be made.

Figure 5:
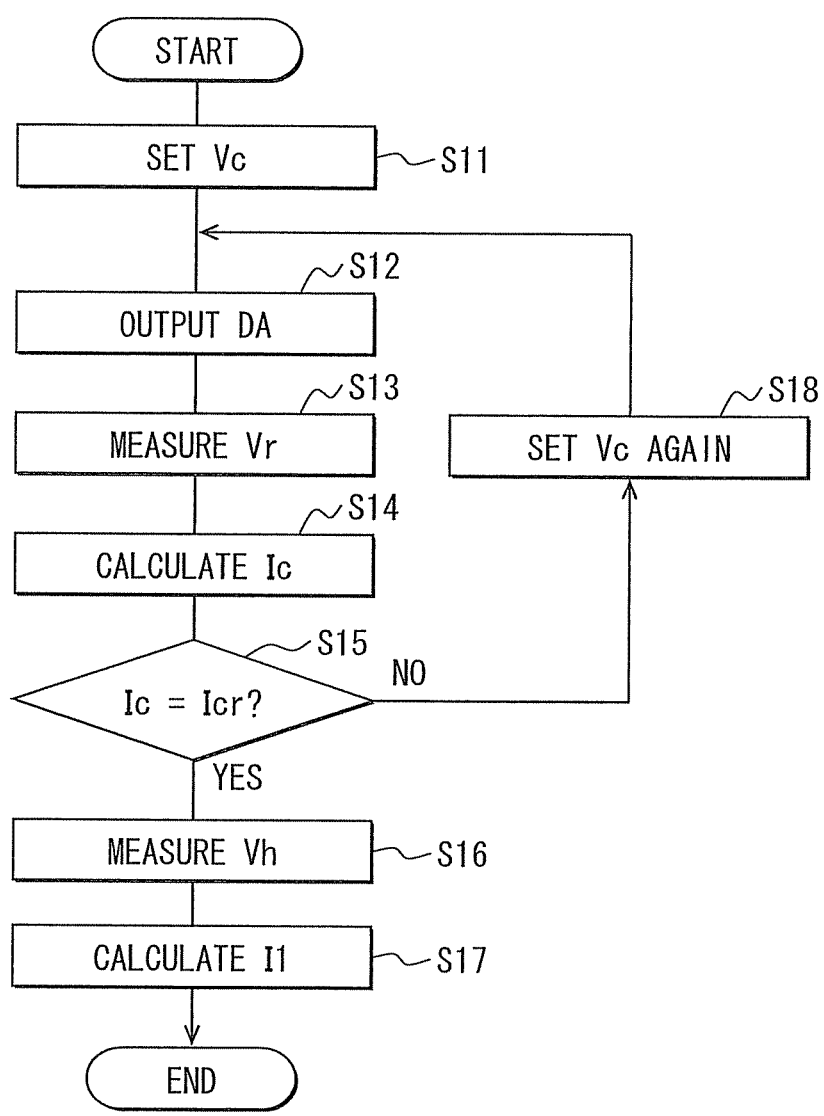
FIG. 5 is a flowchart of one example of current detection processing executed in the embodiment.
Figure 6:
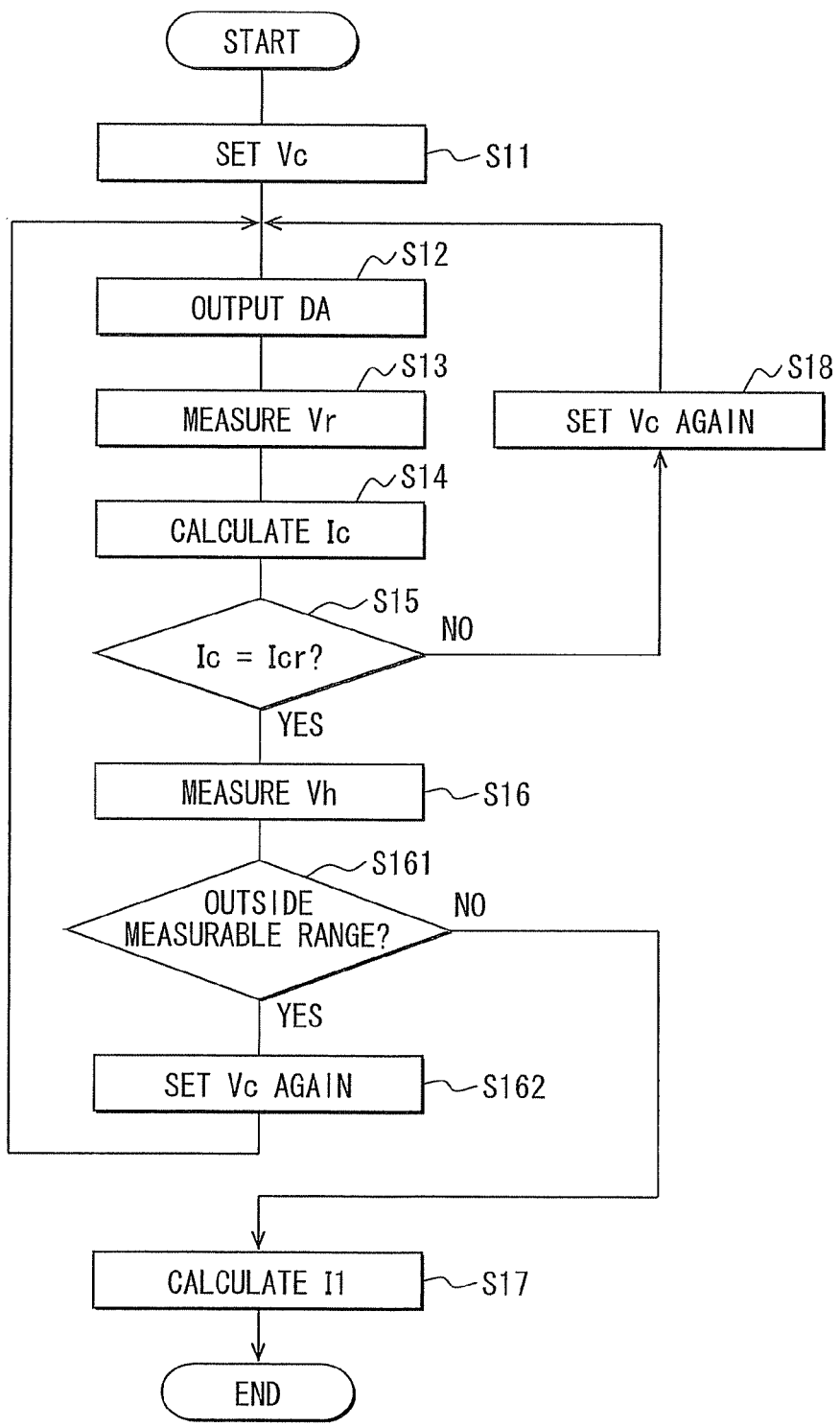
FIG. 6 is a flowchart of another example of current detection processing executed in the embodiment.

After the output voltage Vh is measured in the similar manner as steps S11 to S16 and S18 shown in FIG. 5, it is checked whether the output voltage Vh is outside a measurable range. That is, in case that the accuracy of the A/D converter is 8 bits, the measurable range is from 0 to 255. If the measured value is 255 (that is, upper limit of the measurable range), it is determined that a detected value is outside the measurable range.

If it is determined that the output voltage Vh is within a measurable range (S161: NO), the current I1 is calculated at S17 in the similar manner as the example shown in FIG. 5.

If it is determined that the output voltage Vh is outside the measurable range (S161: YES), the value of the excitation voltage Vc is set again to widen the measurable range, that is, the value of the excitation current Ic is reduced, at S162. Then, a new excitation voltage Vc is outputted at step S12. For example, the value of the excitation current Ic is reduced to one-half and the measurable range is doubled.

The current detection pattern 13 is arranged as exemplified in FIGS. 7A to 7D in cross section.

Figure 7A:
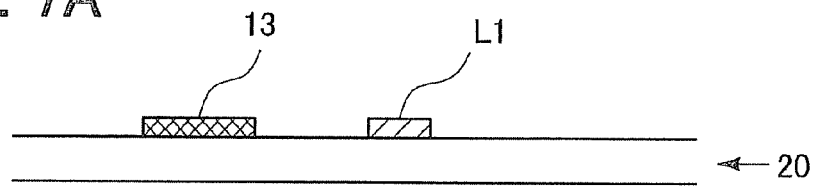
FIGS. 7A to 7D are diagrammatic views of examples of arrangements of current detection patterns.
Figure 7B:
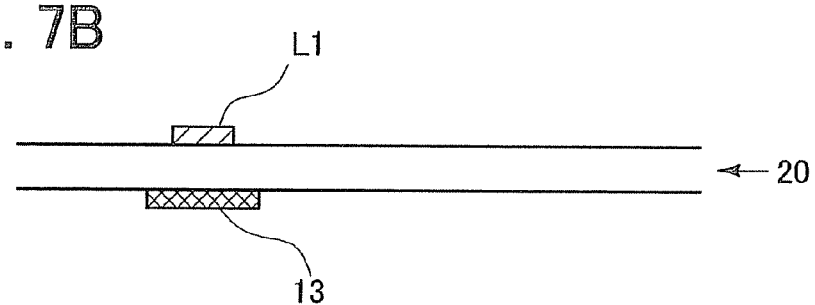

In an example of FIG. 7A, the current flow path L1 (pattern wiring) and the current detection pattern 13 including the resistor R are formed on the same surface of the substrate 20, which is a one-side mount type or a both-side mount type. In another example of FIG. 7B, the current flow path L1 is formed on one surface (top surface) of the substrate 20 and the current detection pattern 13 is formed on the other side (bottom side) of the substrate 20 in a manner to oppose or face the current flow path 11 through the substrate 20.

In case of the both-side mount type, the resistor R may be mounted on the same surface as the current detection pattern 13 or on the different surface from the current detection pattern 13. The current detection pattern 13 may be arranged at any positions on the bottom side of the substrate 20, if it is possible to detect the magnetic field of the current flow path L1. It need not necessarily be arranged to face the current flow path L1.

Figure 7C:
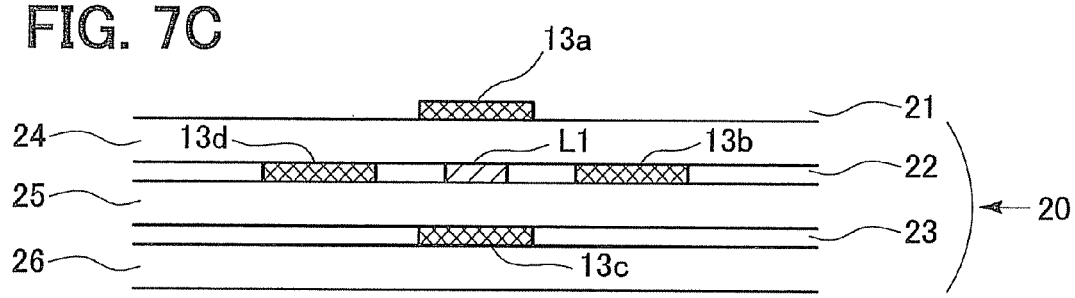

In case of a further example of FIG. 7C, the current flow path L1 and the current detection pattern 13 are formed on a multilayered substrate 20. The substrate 20 is formed of a first layer 21, a second layer 22 and a third layer 23, which are wiring layers. An insulator 24 is formed between the first layer 21 and the second layer 22. An insulator 25 is formed between the second layer 22 and the third layer 23. An insulator 26 is formed on the bottom side of the third layer 23. Thus, the substrate 20 is a three-layered substrate. The current flow path L1 is formed in the second layer 22. The current detection pattern 13 is formed at four parts 13a to 13d. One part 13a is in the first layer 21 over the current flow path L1. Two parts 13b and 13d are in the second layer 22 on both sides of the current flow path L1. Last one part 13c is in the third layer 23 under the current flow path L1. Thus, the current detection patterns 13 at four parts 13a to 13d surround the current flow path L1 in a generally annular shape.

Figure 7D:
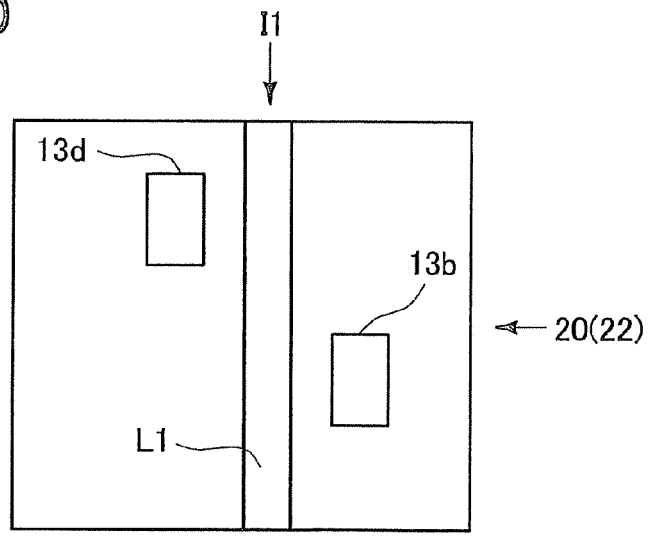

The current detection pattern 13 need not necessarily be formed at four parts. The current detection pattern 13 may be formed at two or three parts, for example, at only two parts 13a and 13c, at only three parts 13a, 13b and 13c. It is also possible in the example of FIG. 7C to form the current detection pattern 13 at two parts 13b and 13d, which are displaced in parallel in a direction of the current flow path L1 as shown in FIG. 7D, which shows a top side of the second layer 22. That is, the current detection patterns 13 need not necessarily be arranged to oppose each other from both sides of the current flow path L1. Further, the current detection patterns 13 need not necessarily be distanced equally from the current flow path L1.

Figure 8A:
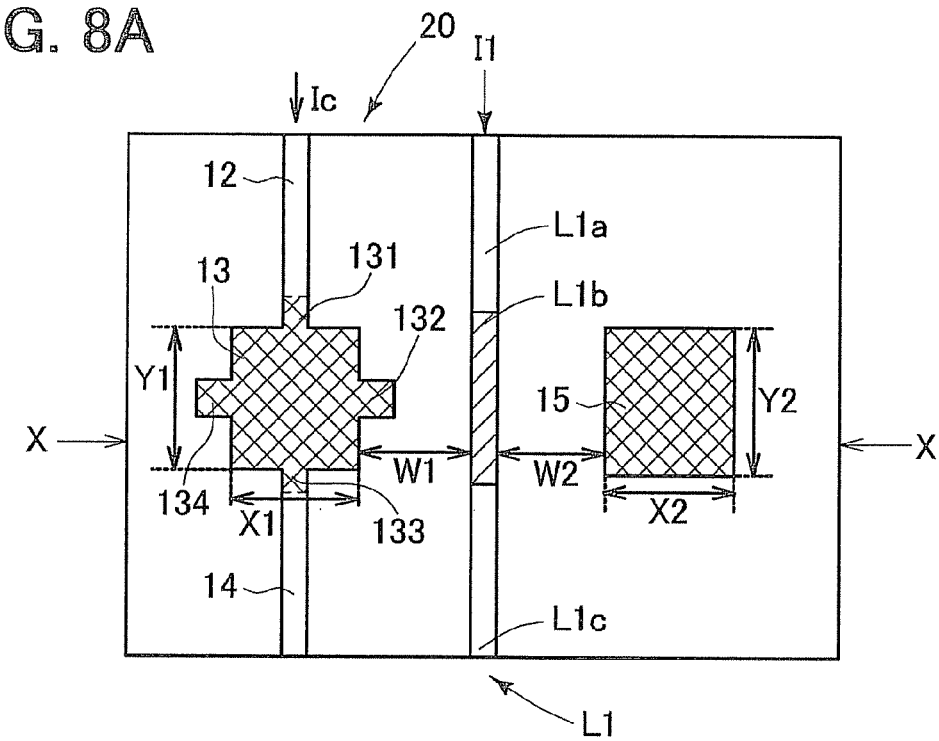
FIGS. 8A to 8C are diagrammatic views of arrangements of current detection patterns.
Figure 8B:
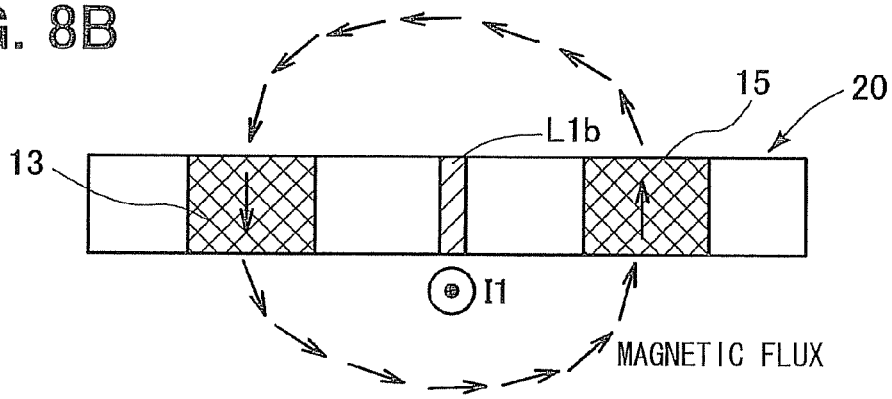
Figure 8C:
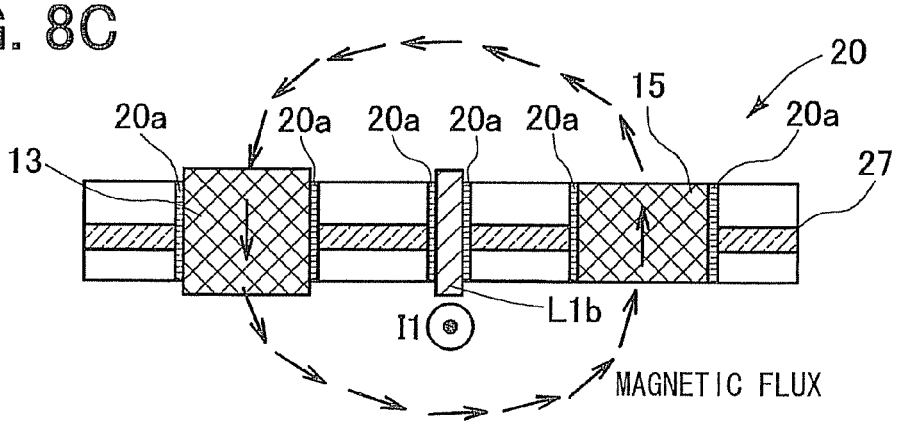

The current detection pattern 13 is arranged as further exemplified in FIGS. 8A to 8C. FIG. 8A shows the substrate 20, which is viewed from above. FIG. 8B shows a cross section of the substrate 20 taken along a line X-X in FIG. 8A in case that the substrate 20 is a single layer substrate, which is a one-side mount type or a both-side mount type. FIG. 8C shows a cross section of the substrate 20 taken along a line X-X in FIG. 8A in case that the substrate 20 is a multilayered substrate.

The substrate 20 has a similar shape as that shown in FIG. 1 when viewed from the above. However, the current detection pattern 13 and a part L1b of the current flow path L1, which faces the current detection pattern 13 in the lateral direction, pass through the substrate 20 in the thickness direction in both examples of FIGS. 8B and 8C. A magnetic flux penetration pattern 15 is additionally formed at a position, which faces the current detection pattern 13 through the current flow path L1 in the lateral direction. The magnetic flux penetration pattern 15 is formed of a similar material as the other wiring patterns of the substrate 20 and formed to pass through the substrate 20 in the thickness direction of the substrate in the examples shown in FIGS. 8B and 8C.

The part L1b as well as the parts L1a and L1c of the current flow path L1 need not necessarily pass through the substrate 20 in the thickness direction. The magnetic flux penetration pattern 15 need not necessarily pass through the substrate 20 in the thickness direction, if the current I1 is detectable.

It is preferred that a side length X2 and a side length Y2 of the magnetic flux penetration pattern 15 in a lateral direction and a longitudinal direction are equal to a side length X1 and a side length Y1 of the current detection pattern 13 in a lateral direction and a longitudinal direction, respectively. The length X1 and the length Y1 do not include the widths of the input terminals 131 and 132 and the widths of the output terminals 132 and 134. The side lengths need not necessarily be equal to each other, if the current I1 is detectable. It is preferred that a distance W2 between the magnetic flux penetration pattern 15 and the current flow path L1 is equal to a distance between the current detection pattern 13 and the current flow path L1. However, the lengths need not necessarily be equal, if the current I1 is detectable.

The length of each side of the current detection pattern 13 and the magnetic flux penetration pattern 15, which are in the rectangle shape, is at most several millimeters. This corresponds to a through hole, which is a little large. Therefore, design and manufacture of a substrate are not hindered and the strength of the substrate 20 is not influenced.

In the examples shown in FIGS. 8A to 8C, since the magnetic flux generated about the current flow path L1, that is, part L1b, passes the current detection pattern 13 and the magnetic flux penetration pattern 15, that is, substrate 20, the magnetic field, that is, current I1, can be detected surely by the current detection pattern 13.

In case of the multilayered substrate shown in FIG. 8C, a contact surface of the current detection pattern 13 with the substrate 20 and a wiring layer 27 may be covered with an insulator 20a so that the current detection pattern 13 and the magnetic flux penetration pattern 15 do not contact the wiring layer 27 formed inside the substrate 20. Similarly, the part L1b of the current flow path L1, which contacts the substrate 20 and the wiring layer 27, may be covered with the insulator 20a.

The present invention is described with reference to a variety of embodiments, which are only exemplary. The present invention may be implemented in different embodiments.

What is claimed is:

1. A current detection device comprising:
   a circuit substrate;
   a wiring pattern formed on the circuit substrate and including a current flow path; and
   a current detection pattern formed in the wiring pattern and having a predetermined area for detecting a current, which flows to a subject body for current measurement through the current flow path, based on magnetic flux density generated by the current,
   wherein the current detection pattern is formed of a same material as the current flow path of the wiring pattern,
   wherein an excitation current supply section is provided for supplying the current detection pattern with an excitation current for detecting the magnetic flux density, and
   wherein a current calculation section is provided for measuring an output voltage outputted from the current detection pattern corresponding to the excitation current and the magnetic flux density, and calculating the current flowing to the subject body through the current flow path based on the magnetic flux density calculated from the excitation current and the output voltage.

2. The current detection device according to claim 1, further comprising:
   a resistor connected in series with the current detection pattern;
   a resistor voltage measurement section for measuring a resistor voltage, which is a potential difference developed between both ends of the resistor; and
   an excitation current calculation section for calculating the excitation current based on the resistor voltage.

3. The current detection device according to claim 2, further comprising:
   an excitation current regulation section for regulating the excitation current to maintain a predetermined value.

4. The current detection device according to claim 1, wherein:
   the excitation current supply section varies the excitation current based on the output voltage.

5. The current detection device according to claim 1, wherein:
   the current detection pattern is formed to penetrate the circuit substrate in a thickness direction of the circuit substrate.

6. The current detection device according to claim 1, further comprising:
   a magnetic flux penetration pattern formed in the circuit substrate,
   wherein the current detection pattern and the magnetic flux penetration pattern are located at both sides of the current flow path.

7. The current detection device according to claim 1, wherein:
   the current detection pattern and the magnetic flux penetration pattern are formed to penetrate the circuit substrate in a thickness direction of the circuit substrate.

8. The current detection device according to claim 1, wherein:
   the circuit substrate has multiple layers; and
   the current detection pattern is formed between two of the multiple layers.

9. The current detection device according to claim 8, wherein:
   the current detection pattern is formed at a plurality of parts in the multiple layers to surround the current flow path.

* * * * *